United States Patent [19]
Malhotra et al.

[11] Patent Number: 6,002,267
[45] Date of Patent: Dec. 14, 1999

[54] IN-LINE VOLTAGE PLANE TESTS FOR MULTI-CHIP MODULES

[75] Inventors: Ashwani K. Malhotra, Beacon; John R. Pennacchia, Wappingers Falls; Ronald R. Shields, Poughkeepsie; Thomas A. Wassick, Lagrangeville, all of N.Y.

[73] Assignee: International Business Machines Corp., Armonk, N.Y.

[21] Appl. No.: 08/898,757

[22] Filed: Jul. 23, 1997

[51] Int. Cl.⁶ ..................................................... G01R 31/02
[52] U.S. Cl. ............................................. 324/765; 324/537
[58] Field of Search ............................ 324/765, 763, 324/755, 525, 537

[56] References Cited

U.S. PATENT DOCUMENTS

| | | | |
|---|---|---|---|
| 4,288,911 | 9/1981 | Ports | 438/17 |
| 4,479,088 | 10/1984 | Stopper | 324/525 |
| 4,812,742 | 3/1989 | Abel et al. | 324/537 |
| 5,059,899 | 10/1991 | Farnsworth et al. | 438/18 |
| 5,097,205 | 3/1992 | Toyoda | 324/763 |
| 5,239,191 | 8/1993 | Sakumoto et al. | 257/203 |
| 5,252,844 | 10/1993 | Takagi | 257/296 |
| 5,876,842 | 3/1999 | Duffy et al. | 428/209 |
| 5,880,590 | 3/1999 | Desai et al. | 324/755 X |

*Primary Examiner*—Josie Ballato
*Assistant Examiner*—T. R. Sundaram
*Attorney, Agent, or Firm*—Whitham, Curtis & Whitham; Tiffany Townsend

[57] ABSTRACT

A test pad is formed outside an array of pads included in connection structures such as pin mounting pads to which connection pins may be brazed in, for example, bottom side metallurgy of a multi-layer modular electronic package. In-line voltage plane testing may then be accomplished through temporary connections to the test pads for any desired layer, such as top side metallurgy distribution layers, while protecting the pin-mounting pads from physical and/or chemical damage or contamination during manufacturing processes for addition of layers to the electrical interconnection structure of the multi-layer module.

16 Claims, 2 Drawing Sheets

IN-LINE VOLTAGE PLANE TESTS FOR MULTI-CHIP MODULES

BACKGROUND OF THE INVENTION

1. Field of the Invention

The present invention generally relates to the manufacture and testing of electronic circuit modules which include a plurality of integrated semiconductor chips and, more particularly, to the testing of modular circuit structures during the course of manufacture and within an automated manufacturing line.

2. Description of the Prior Art

It has long been recognized that high density of integration of electronic circuits on semiconductor chips yields substantial economy of manufacture so long as manufacturing yield can be maintained since many more electronic elements can be formed and connected during the necessary process steps. At the same time, performance improvements are realized since connections of reduced length have reduced capacitance and accordingly reduced signal propagation time and susceptibility to electrical noise. The same economies and performance improvements accrue to arrangements for connecting multiple chips for the same reasons.

In order to realize such advantages in arrangements for connecting plural integrated circuit chips, so-called multi-layer modular (MLM) packages have been developed in recent years. Such packages are, at the present time, generally rectangular and between 40 mm and 125 mm on a side and can accommodate from as few as two to several hundred chips. These packages are comprised of a plurality of lamina, each having a pattern of connections formed thereon and providing apertures known as vias which are filled or lined with metal or conductive paste or other conductive material such as plated metal to provide connections from one layer of conductive pattern to another. These lamina carrying conductive patterns and vias are aligned with each other in a stack and bonded together (e.g. by sintering if the lamina are ceramic, thermoplastic bonding if of polyimide and the like in accordance with the material of the lamina) to form a mechanically robust network of finely spaced connections embedded in a solid body of material, referred to thereafter as a substrate.

For numerous manufacturing reasons, vias and conductors on or in the substrate are generally provided at a pitch which is significantly larger than the pitch of connection pads on chips through the major portion of the body of an MLM device. Similarly, the connection pads to which pins may be later attached for connecting the module to a circuit board, another substrate or the like may be at a different pitch (either larger or smaller) or pattern than vias and conductors carrying power and signals within the substrate. Accordingly, it is customary to provide a plurality of additional layers or lamina, generally of a polyimide thin film construction, on the top and bottom surfaces of the multi-layer module substrate (e.g. a multi-layer ceramic portion in multi-layer ceramic (MLC) packages) principally to provide alteration of connection pad spacing or pattern, sometimes in plural stages. Such layers are generally referred to as "distribution" or "redistribution" layers.

The complexity of MLMs makes provision for testing and repair (referred to as engineering changes (ECs)) during manufacture very desirable since the patterns on the lamina and via filling is generally accomplished by relatively expensive individual screening processes. While connections and connection pads are very dense, small and closely spaced, it is usually possible to provide redundant connection structures which are accessible by mechanical automated repair apparatus as part of the design. Thus, repair of marginal or defective connections can avoid loss of the economic cost of manufacturing processes prior to testing when a marginal or defective connection is found. Conversely, detection of a module substrate which cannot be repaired allows the cost of further processing of a substrate which must eventually be discarded to be avoided.

In recent years, however, the performance of integrated circuit chips has advanced to the point where connections through the distribution layers to the major (substrate) portion of the MLM package (where complex interconnections are generally formed) may be of excessive length for numerous critical signal paths. Therefore, it has become the practice to include connections for at least some of such critical signal paths within the distribution layers rather than the substrate in order to shorten the required connections. Connection patterns in the distribution layers have thus become markedly more complex and more densely populated with conductors. Testing of these more complex layers, particularly at points during manufacture when repair is most likely to be possible, has become correspondingly more intricate and stringent. Increased numbers of thin film distribution layers increases the required number of tests, as well.

It is desirable, during such testing, to test the entirety of the modular device assembled up to the point of the test. That is, all wiring or connection layers which have been assembled up to the point of the test should be tested together. Such tests should be run at intervals of no more than a few lamina (and preferably at each thin film lamina level) so that engineering changes can be made most simply or, if not possible to correct the condition of the structure, so that few, if any, further process steps will be carried out on a structure beyond the processing which produced the irreparable defect.

From the accommodation of multiple chips and the nominal dimensions of the modular package structure alluded to above, it can be understood that a much larger area must meet functional requirements than is involved on a single chip. To test the functionality of the device over such an area, connections must be made to the so-called voltage plane or bottom surface metallurgy (BSM) pads which will eventually receive the pins to attach the module to the device in which it will be placed in service. One of these tests is a so-called voltage plane test which is principally directed to determining if certain extensive connections running throughout the substrate and distribution layers are shorted to each other or to other connections.

Generally, it is desirable that the testing of modular package structures be performed without removing the module from the manufacturing line (and thus is referred to as "in-line" testing) to preserve alignment within automated manufacturing devices and to avoid incidental damage and contamination due to additional handling of partially completed packages. In-line testing also preserves potential throughput of the manufacturing line even when numerous tests must be done at a number of points in the manufacturing process since only the time of the test, itself, is required and interference with the manufacturing line to remove and re-insert structures is avoided. Voltage plane tests are among a series of standard tests which are preferably performed as in-line tests.

It should be appreciated, in this regard, that while connections may also be made to the top surface connections (referred to as top side metallurgy) of the module being manufactured for a single particular test or test series, additional lamina may later be placed thereon and any damage to the conductive pattern due to the connection to top surface metallurgy (TSM) patterns occasioned by the test may generally be repaired. In contrast, temporary connections must be repeatedly made to the BSM pads for a plurality of tests and, for that reason, at the current state of the art, the BSM pads remain exposed through the further lamination and chip attachment TSM processes. Either the repeated formation of temporary connections for testing or the exposure during manufacturing processes or a combination thereof often results in mechanical and/or chemical damage to and/or contamination of the BSM pads reducing yield or requiring rework during subsequent pin attachment (e.g. brazing) processes. Damage to the connection pads may also compromise tests which may be performed as the package structure nears completion and unnecessarily further reduce manufacturing yield after most of the cost of completion of the package has been incurred.

While BSM connection pads could theoretically be covered during TSM lamina processing steps, any such covering must be removed, opened or pierced prior to or as part of further testing. Placement and removal of such a covering or portions thereof can also be a source of damage to the BSM connection pads. Further, covering of the pads during processing for addition of distribution layers does not address the issue of damage to BSM pads due to repeated formation of temporary connections for testing. In this regard, the metallurgy of BSM pads can not generally be altered to make them more chemically and/or mechanically durable during manufacture and testing incident thereto without compromising the pin attachment process. Provision of redundant pads within the array of BSM pads is inconvenient in regard to development of convenient and desirable connection pin configurations and occupies module connection pad space while necessarily preventing minimization of connection length and would require additional redundant wiring within the MLM which would occupy valuable wiring area, locations and volume.

Formation of redundant connections for engineering changes alluded to above generally includes the formation of so-called EC or dog-bone pads on the surface of the package structure (at appropriate points during the manufacturing process) which are at intermediate locations along many conductors in the design, including redundant conductors and which are accessible when repairs may be needed and performed. Such EC pads are essentially a pair of pads placed close together and connected by a narrow strip of conductor. The pads are of a size which is accessible by automated connection forming machinery while the narrow conductor is dimensioned to be readily destroyed by laser ablation processes, mechanical cutting or the like, including fusing by application of high current.

Thus, potentially any portion of potentially any conductor and/or redundant conductor in the design can be isolated from the remainder of the conductor and new connections made such as to substitute a portion of any convenient redundant conductor. Nevertheless, it should be recognized that such formations as EC pads are intended only for the formation of permanent connections (as opposed to repeated, temporary connections of test pads) and then only as needed for repair of other connections in the module.

It is also known to provide test connections for individual chips on a wafer so that electrical properties of the individual chips can be determined prior to dicing of the wafer into such individual chips. However, to avoid increasing required chip space, such test connections are generally made in the kerf areas of the wafer which will be consumed by the dicing process. Therefore, test connections do not ordinarily exist at the individual chip or package level. Further, processing of and connections to wafers involve only a single side of the wafer; specific areas of which can generally be masked and opened as may be necessary. Accordingly, chemical and mechanical damage and contamination of connections during processing does not generally present a problem since a covering layer may be readily applied and removed without damage to metallization. In any event, testing prior to completion or dicing of a chip is generally limited to screening for process-related defects at the wafer level. Additionally, at the individual chip level, temporary test connections are not generally made to the chip itself but rather are made to lead frames, solder preforms or bumps or the like which are permanently connected to contact pads on the chip.

Additionally, it is often desirable to perform other types of tests such as metallurgical or adhesion tests on connection pads. However, pads which are needed for mounting of pins and connections to the circuit package would necessarily be damaged by metallurgical and mechanical tests since such tests, by their nature, generally involve the application of potentially destructive forces or the removal of material. Tests on other structures such as metallization specifically provided for such testing may not provide reliable information since their function as connectors is not testable because they are not generally connected to the circuitry of the package and processing differences, such as heat exposure during pin brazing, may affect the properties being tested.

It is also becoming more desirable to provide for diagnostic testing of an installed electronic circuit package as package complexity increases since increased complexity is generally reflected in the number of connection pins on the package. An increased number of connection pins increases the potential for damage to one or more pins or the package itself during removal of the package from a device in which it is installed, connection to and/or disconnection from a tester and reinsertion into the device. Increased integration density allows some diagnostic circuitry to be placed in the package, if desired, but pin locations to extract signals from the package are often not available and cannot be efficiently provided in any event since the anticipated low frequency of such testing does not justify the package space required or the manufacturing costs of adding dedicated pins on the package.

In summary, no alternative has been available in the art to avoid exposure of BSM pads during MLM package manufacture consistent with avoidance or limitation of damage to BSM pads and compromise of pin attachment processes while permitting repeated in-line testing at points in the manufacturing process and/or line at which repairs may be most readily carried out. Additionally, the current trend toward increased complexity of connections and number of lamina used in TSM thin film distribution layers and testing incident to its manufacture and rework increases the potential for damage and/or contamination of BSM pads in modern MLM and MLC packages as well as their cost of manufacture which is put at risk by such damage or contamination. Further, no alternative has existed for avoiding provision of separate structures for electrical, mechanical and chemical/metallurgical testing or for testing the package after it is placed in service.

SUMMARY OF THE INVENTION

It is therefore an object of the present invention to provide an arrangement for voltage plane testing which permits avoidance of damage and contamination of connection pads of electronic circuit packages during manufacture.

It is another object of the invention to provide for in-line testing as well as any or all of electrical, mechanical, chemical/metallurgical testing and field testing and diagnostics with a single structure which can be formed without significant additional manufacturing processes.

It is a further object of the invention to provide for use of test pad materials which are different from and may not be suitable for active circuits of an electronic circuit package.

It is a yet further object of the invention to provide electrical contacts for through-substrate interconnections for defining contact patterns for electroplating.

In order to accomplish these and other objects of the invention, a method of manufacturing a multi-layer modular electronic circuit package is provided including the steps of forming an array of pads and an additional pad, electrically connected to a pad of the array of pads, outside the array of pads on a first surface of a multi-layer interconnection structure, applying a protective layer over the array of pads, applying a layer including an electrical connection on a second side of the multi-layer interconnection structure, making a temporary connection to the additional pad for testing of at least the layer, removing a portion of the protective layer, and completing the multi-layer modular electronic circuit package.

In accordance with another aspect of the invention, a multi-layer electronic circuit structure is provided including an array of pads on a surface of a layer of the multi-layer interconnection structure, a test pad on the surface of a layer of the multi-layer interconnection structure, and an electrical connection between the test pad and a pad of the array of pads whereby the array of pads may be protected while temporary connections are made to the test pad.

In accordance with a further aspect of the invention, a multi-layer electronic circuit package is provided including an array of connection structures on a surface of the electronic circuit package including a pad on a surface of a layer of said multi-layer electronic circuit package, a test pad on a layer of the multi-layer electronic circuit package located outside the array of interconnection structures, and an electrical connection from the test pad to one of the connection structures of the array of connection structures.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
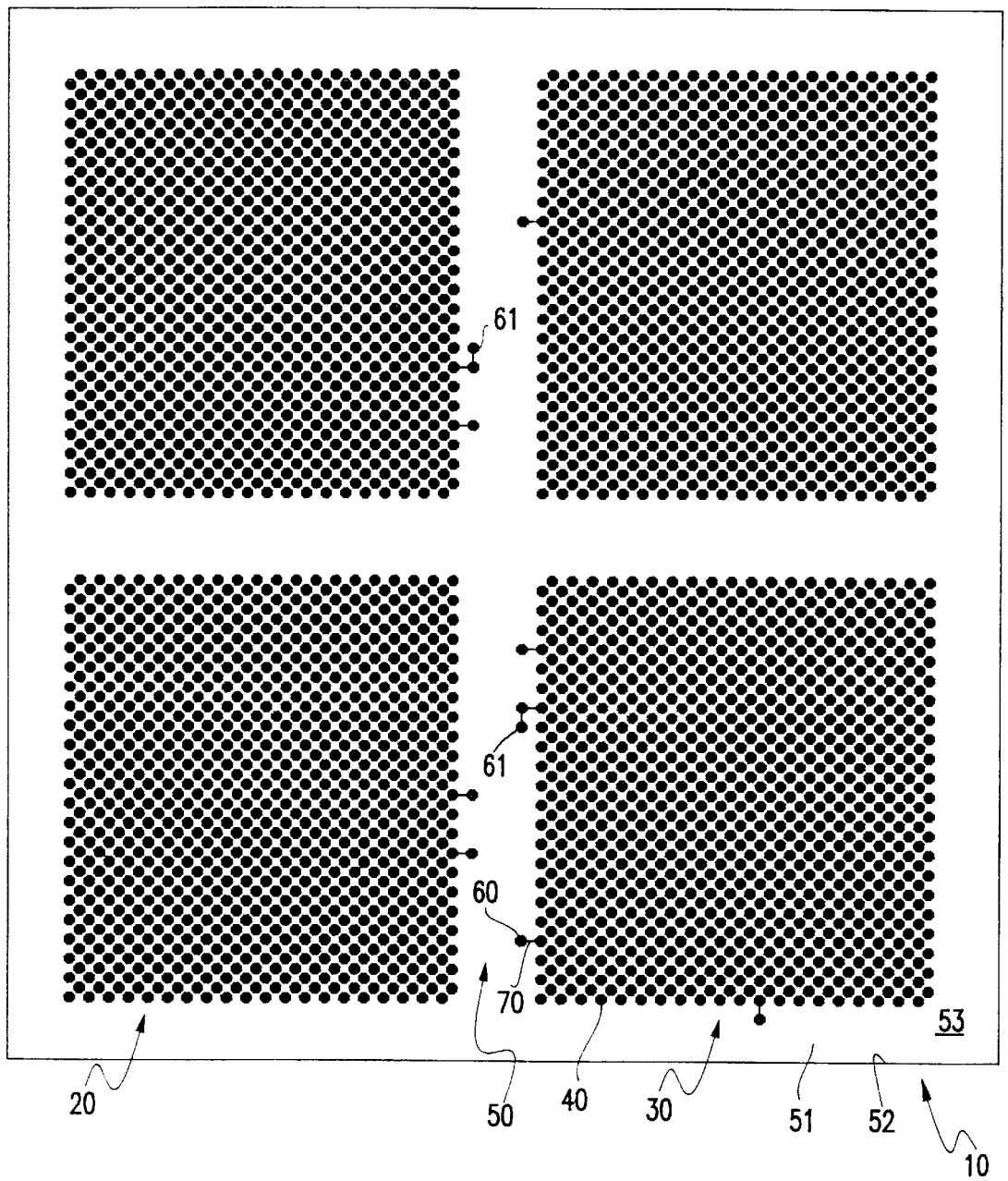
FIG. 1 is an exemplary bottom surface metallurgy (BSM) pattern including the invention in plan view.

Referring now to the drawings, and more particularly to FIG. 1, there is shown an exemplary bottom surface metallurgy (BSM) pattern 10 for a multi-layer modular circuit package including the invention. Contact pads 40 are preferably of a common shape; the octagonal shape illustrated being particularly convenient and electrically preferable for providing regularity of spacing therebetween. As is generally customary, the pattern is divided into two or more sections 20, 30 (four such sections being illustrated) of closely spaced contact pads 40 separated by inactive regions 50. A similarly inactive margin 51 is generally provided between the active regions 20, 30 and the edge 52 of the package substrate 53. It should be understood that a similar pattern but possibly having smaller capture pads at a finer pitch and divided into more numerous areas corresponding to individual chip sites would If be provided in top surface metallurgy (TSM) on the substrate or in distribution lamina and the invention may also be applied to such TSM while forming BSM layers, if desired.

Figure 2:
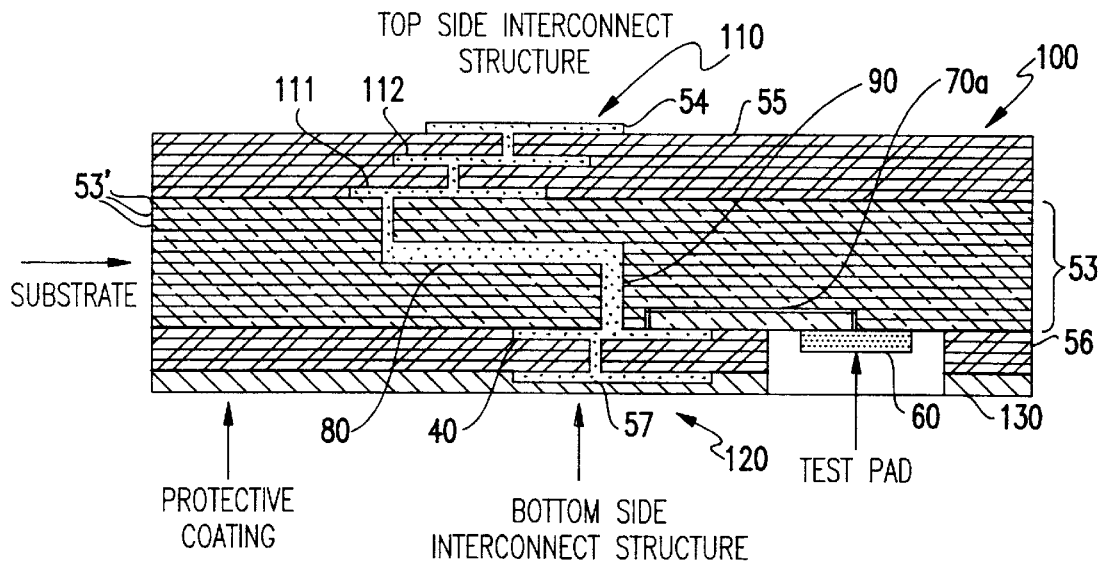
FIG. 2 is a cross-sectional view of a BSM and test pad structure with an internal test pad connection in accordance with the invention.
Figure 3:
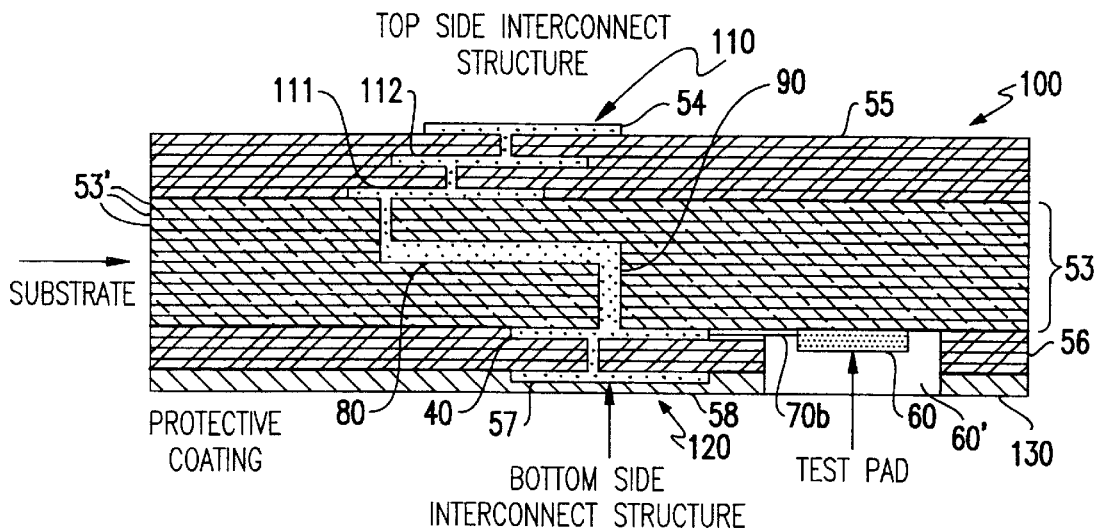
FIG. 3 is a cross-sectional view of a BSM and test pad structure with a test pad connection on a surface of a multi-layer substrate in accordance with the invention.

In accordance with the invention, test pads 60 are provided in the inactive regions 50 and/or margins 51 and connected to selected connection pads 40 by connections 70 which may be on the surface of the substrate 53, as shown in FIG. 3, or internal thereto, as shown in FIG. 2. In general, internal connections are only required or preferred when connection must be made to connection or pin mounting pads 40 on the interior of active regions 20, 30 and surface connections are generally preferred for connection to pads on the boundaries of active regions, as shown. Desired connections can generally be brought to any location in an active region 20, 30, such as pads at the boundary of active regions by suitable design of the lamina of the substrate and internal connections should, in theory, be seldom required.

However, many manufacturing and package design considerations may be involved in choice of internal or surface connections 70. For example, test pads 60 and connections 70 can be formed on the multi-layer substrate surface in the same process step used to form pin mounting pads 40 but formation in the same process limits the composition of the test pads 60 and connections 70 to the same material as pads 40. However, a different material (or a covering of one or more additional layers of material) may be desired for test pads 60. A different material may be especially useful if the environment or chemicals to which the product is exposed for top side metallurgy manufacturing may damage the bottom side structure or if the material required for pads 40 is not preferred for testing. Under such conditions, additional process steps such as plating, evaporation or the like, as may be appropriate to materials of the desired chemical or mechanical robustness may be used to add further surface layers test pads 60 and/or connections 70. Further, the test pads 60 and/or connections 70 could be entirely made of different material than pads 40. In either case, suitable methods appropriate to the materials will be evident to those skilled in the art in view of the present description of the invention.

Referring now to both FIGS. 2 and 3, a representative small portion of the multi-layer modular circuit package structure is schematically (e.g. including singular, representative structures) illustrated in cross-sectional view. The plurality of lamina 53' in multi-layer substrate 53 include a connection formed by a pattern portion 80 formed on a lamina surface by, for example, screening, as described above, and portions 90 formed by, in this case, paste filled vias in the respective lamina although metal plating could be used.

The top side interconnect structure 110 is also a layered structure preferably formed by a plurality of thin film lamina 55 by known techniques. The multiple connections are illustrated as progressing at an angle between a top side pattern pad 111 and a capture pad 54 to depict geometry characteristic of distribution layers or "wiring" as well as intermediate connection layers (e.g. 112) for critical signal paths as alluded to above. Similar but somewhat simpler bottom side distribution wiring 120 may be provided in a similar, possibly multi-layer structure 56 to make connection to BSM pad 40 in which case pad 57 may directly overlay pad 40.

In accordance with the embodiment of the invention depicted in FIG. 2, a connection 70a is formed through and across some of the lamina to connect pad 40 to test pad 60 in the same manner as and concurrently with connection 80, 90, described above. Of course, the connection need not be made directly to pad 40 but can be connected at any point along the node including any point of connections 80 and 90. In FIG. 3, a connection 70b is preferably formed after completion of the substrate (preferably by physical evaporation deposition using an evaporation mask patterned to include apertures corresponding to test pads 60 and connections 70 as well as pads corresponding to 40) but prior to application of the BSM thin film layers, if used (though preferred), by any suitable surface deposition technique as will be apparent to those skilled in the art. Such alternative techniques may include lithographic patterning followed by plating or etching or screening of a conductive paste. Preferably, as alluded to above, if no internal connections 70a are required and the same material used for pads 40 is acceptable, formation of connections 70b and pads 60 is advantageously accomplished concurrently with deposition and patterning of pads 40. However, as alluded to above, use of layer 56 and pad 57 permits different metallurgy for pads 40 and 57 and also can advantageously provides relief of high stresses which may be caused in the course of later pin brazing processes.

If desired, as is considered to be preferable to provide a recessing of test pads 60 so that they may be left in place on the package, in either of the variations of the invention illustrated in FIGS. 2 and 3, it is preferred to form test pad 60 prior to application of the BSM thin film layers, although test pad 60 could also be applied after patterning of the protective layer 130 and the BSM thin film layers 56. Whether or not one or more BSM thin film layers are employed, a protection layer 58, preferably of a polyimide or other material which is substantially inert to materials employed in TSM processes is applied to cover BSM pads 40 or 57 while test pads 60 are exposed, preferably by laser ablation or lithographic patterning after protective layer 58 is applied. In this regard, it is considered a desirable feature of the invention to provide redundant test pads 61 (FIG. 1) connected to test pads 60, particularly if the same metallurgy as is used for test pads 40 is used since test pads 60, 61 are always subject to damage during testing and TSM processes. Therefore, if connections are initially made to redundant test pad 61 and that test pad becomes damaged, pad 60 can be exposed (again, preferably by laser ablation) and used thereafter.

Once the mechanically and/or chemically robust protective layer 58 is in place, TSM thin film processes interspersed with voltage plane test processes and "ton-site" or in-line repairs, if necessary, may be carried out. At the completion of formation of the TSM thin film layers, protective layer 58 may be removed or simply opened at pads 57 (or 40, if BSM thin film layers 56 are not employed) and the package completed by the addition of chips by connection to the TSM (and, for example, pins to the BSM). Any packages which could not be repaired will have been discarded and the substantial cost of further processing of the package will only be incurred when the TSM and substrate layers are known good and the BSM pads will have been isolated from potential damage while forming the TSM layers and the making of that determination.

It should also be noted as a perfecting feature or alternative use of the present invention, test pads 60, 61 may be useful in the formation of the TSM thin film layers as well as in the testing thereof. For example, it may be desired to provide plating on one or more layers of TSM connections or otherwise modify the metallurgy thereof after conductive patterns are placed on the respective lamina. In view of the reduced spacing in TSM distribution layers, surface connections rather than discrete wires may be desired for additional (e.g. EC) connections. Likewise, surface treatments of TSM pads may be desired. For such purposes, test pads 60, 61, which may be arranged for voltage plane tests may also be used to provide for a current through TSM pads for purposes such as electroplating of connective patterns, surface metallurgy, solder deposition or the like. Depending on the design and connectivity of the test pads through the substrate 53 and TSM thin film layers, TSM pads may be treated in such a manner either uniformly for all pads or selectively for groups or single pads.

It should also be understood that test pad 60 can be allowed to remain in place and accessible as may be desirable for later field testing and diagnostics. If accessibility is not desired, test pads 60 and connections thereto 70b, if exposed, can be covered by micro-passivation (e.g. filling apertures 60' with polyimide or other passivation material) or by disconnecting them by severing of connection 70b. Alternatively, either or both of test pads 60 and/or redundant test pads 61 can be used for localized chemical or mechanical testing. In this latter regard, it should be noted that the results of chemical and/or mechanical testing are somewhat more meaningful since connection 70 has allowed the pad to serve as a connection during testing and is known to be a properly formed conductor representative of other conductors in the BSM.

In view of the foregoing, it is seen that the invention provides for full protection from mechanical or chemical damage or contamination of the BSM pads 40, 57 during formation of TSM layers and in-line voltage plane testing. Metallurgy which differs from that for pads of the BSM contact array may be used for the test pads to avoid compromise of other processes such as pin brazing later required to complete the package.

While the invention has been described in terms of a single preferred embodiment, many variations thereon including application at a plurality of different stages of BSM and TSM processing as will be evident to those skilled in the art in view of the foregoing description. For example, numerous suitable manufacturing variations will be evident to those skilled in the art in view of the above description of a preferred form of the invention and representative variations thereon. As alluded to above, the invention may be employed in TSM during formation and testing of BSM layers by applying a passivation layer 130 or thin film layer 56 as a passivation layer over contacts 40, carrying out the TSM processing and testing, then forming BSM pads 57 and via connections to pads 40 though openings then formed in layer 56 by physical evaporation or other deposition processes. Further BSM layers can also be later added in similar fashion.

In this regard, the invention may be advantageously employed to extend the thoroughness of in-line tests possible since the TSM distribution layers will, to the extent permitted in the design by critical interconnection paths, allow progressively more surface space to be utilized for test pads in the TSM as further layers are added and capture pad patterns reduced in area to correspond to chips. Therefore, it is projected that the invention may be advantageously applied in an alternating fashion to both TSM and BSM layer formation of a multi-layer interconnection structure which includes at least a multi-layer substrate and any previously applied top side or bottom side layers including connections as multi-layer modular circuitry packages become more complex to limit costs and increase manufacturing yield.

Therefore, it will be evident to those skilled in the art that the invention can be advantageously practiced with modification within the spirit and scope of the appended claims.

Having thus described my invention, what we claim as new and desire to secure by Letters Patent is as follows:

1. A method of manufacturing a multi-layer modular electronic circuit package including the steps of forming an array of pads and an additional pad outside said array of pads on a first surface of a multi-layer interconnection structure, said additional pad being electrically connected to a pad of said array of pads, applying a protective layer over said array of pads, applying a layer including an electrical connection on a second surface of said multi-layer interconnection structure, making a temporary connection to said additional pad for testing of said layer including said connection included by said layer, removing a portion of said protective layer, and completing said multi-layer modular electronic circuit package.

2. A method as recited in claim 1, including the further step of forming a connection between said pad of said array of pads and said additional pad on a surface of said multi-layer interconnection structure.

3. A method as recited in claim 1, including the further step of forming a connection between said pad of said array of pads and said additional pad within said multi-layer interconnection structure.

4. A method recited in claim 3, wherein said connection includes a portion of a connection between said pad of said array of pads and said electrical connection included by said layer on said second side of said multi-layer interconnection structure.

5. A method recited in claim 1, including the further step of providing a current through said test pad, said multi-layer interconnection structure and a connection on said layer on said second side of said multi-layer interconnection structure.

6. A multi-layer electronic interconnection structure including an array of pads on a surface of a layer of said multi-layer interconnection structure, a test pad on said surface of a layer of said multi-layer interconnection structure, an electrical connection between said test pad and a pad of said array of pads, and a protective layer covering said array of pads, whereby said array of pads may be protected while temporary connections are made to said test pad.

7. An electronic structure as recited in claim 6, wherein said electrical connection is on said surface of said layer of said multi-layer interconnection structure.

8. An electronic structure as recited in claim 6, wherein said electrical connection is formed internally of said multi-layer interconnection structure.

9. An electronic structure as recited in claim 8, further including an additional electrical connection formed internally of said multi-layer interconnection structure.

10. An electronic structure as recited in claim 6, further including connection structures on another surface of said electronic interconnection structure opposite said surface of said layer and connected to respective pads of said array of pads.

11. A multi-layer electronic circuit package including an array of connection structures on a surface of said electronic circuit package and extending within said electronic circuit package, said connection structures of said array of connection structures including a pad on a surface of a layer of said multi-layer layer electronic circuit package, a test pad on said layer of said multi-layer electronic circuit package located outside said array of interconnection structures, a protective layer having an aperture at a location of said test pad and covering said pad on said surface of said layer, and an electrical connection from said test pad to one of said connection structures of said array of connection structures.

12. An electronic circuit package as recited in claim 11, wherein said electrical connection is on said surface of said layer of said multi-layer interconnection structure.

13. An electronic circuit package as recited in claim 11, wherein said electrical connection is formed internally of said multi-layer interconnection structure.

14. An electronic circuit package as recited in claim 13, further including an additional electrical connection formed internally of said multi-layer interconnection structure.

15. An electronic circuit package as recited in claim 11, further including an insulating layer including at least one via, and a connection pad overlying a connection structure of said array of connection structures and connected to said connection structure through said via in said insulating layer.

16. An electronic circuit package as recited in claim 11, wherein said interconnection structures include connection structures on another surface of another layer opposite said surface of said layer of said multi-layer electronic circuit package.

* * * * *